United States Patent
Iida et al.

(10) Patent No.: US 9,308,552 B2
(45) Date of Patent: Apr. 12, 2016

(54) CURABLE COMPOSITION AND METHOD OF FORMING PATTERN

(71) Applicant: CANON KABUSHIKI KAISHA, Tokyo (JP)

(72) Inventors: Kenichi Iida, Kawasaki (JP); Toshiki Ito, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 466 days.

(21) Appl. No.: 13/682,464

(22) Filed: Nov. 20, 2012

(65) Prior Publication Data
US 2013/0136901 A1    May 30, 2013

(30) Foreign Application Priority Data
Nov. 28, 2011  (JP) .................. 2011-259271

(51) Int. Cl.
*B82Y 10/00* (2011.01)
*B05D 5/00* (2006.01)
*G03F 7/00* (2006.01)
*B82Y 40/00* (2011.01)

(52) U.S. Cl.
CPC . *B05D 5/00* (2013.01); *B82Y 10/00* (2013.01); *B82Y 40/00* (2013.01); *G03F 7/0002* (2013.01); *Y10T 428/24802* (2015.01)

(58) Field of Classification Search
CPC ..................................... G03F 7/0002
See application file for complete search history.

(56) References Cited

U.S. PATENT DOCUMENTS

| | | | |
|---|---|---|---|
| 4,530,953 A | 7/1985 | Yoshikda | |
| 5,259,926 A | 11/1993 | Kuwabara et al. | |
| 8,419,995 B2 | 4/2013 | Yoneda et al. | |
| 2004/0259332 A1* | 12/2004 | Fukuoka et al. | 438/464 |
| 2007/0267764 A1 | 11/2007 | Morimoto | |
| 2008/0167396 A1 | 7/2008 | Murao | |
| 2010/0078860 A1* | 4/2010 | Yoneda et al. | 264/496 |

FOREIGN PATENT DOCUMENTS

| | | |
|---|---|---|
| JP | 2010-103464 | 5/2010 |
| JP | 2010-262980 | 11/2010 |

* cited by examiner

*Primary Examiner* — Ian Rummel
(74) *Attorney, Agent, or Firm* — Canon U.S.A. Inc., IP Division

(57) ABSTRACT

A curable composition that can be released from a mold simply within a short period of time after photo-curing by a small mold-releasing force is provided. The curable composition contains a gas-generating agent that generates a gas by pressure application. A method of forming a pattern is also provided. In the method, the mold can be released with a small force.

3 Claims, 2 Drawing Sheets

CURABLE COMPOSITION AND METHOD OF FORMING PATTERN

BACKGROUND OF THE INVENTION

1. Field of the Invention

The present invention relates to a novel curable composition and a method of forming a pattern, specifically, a method of forming a pattern by photo-nanoimprint.

2. Description of the Related Art

In a photo-nanoimprint method, a resin thin film on a substrate is pressed with a depression pattern of a die and is cured to transfer the pattern of the die to the resin thin film. The die is called, for example, a stamper or a mold.

In the photo-nanoimprint method, since a mold (die) and a cured product (resin thin film) are in contact with each other, a large force to release them from each other, i.e., a large mold-releasing force, is necessary. A larger mold-releasing force may cause defects such as a crack in the pattern of the cured product or may reduce the accuracy in alignment by floating of the substrate having the cured product from the stage on which the substrate placed. Accordingly, there is a demand for reducing the mold-releasing force.

Japanese Patent Laid-Open No. 2010-262980 discloses a gas-generating agent-containing curable composition for nanoimprint lithography.

Japanese Patent Laid-Open No. 2010-103464 discloses an imprint method using a photo-curable resin that generates a gas under at least one condition selected from heating and pressuring or reducing pressure (paragraph 0118). In the method utilizing a pressure disclosed therein, a mold is brought into contact with a photo-curable resin in a high pressure atmosphere, and then the photo-curable resin is irradiated with light through the mold and is thereby cured. Subsequently, the high pressure atmosphere is changed to a reduced pressure atmosphere. As a result, the gas dissolved in the photo-curable resin vaporizes to accumulate at the interface between the photo-curable resin and the mold. The gas (out gas) accumulated at the interface decreases the adhesion between the photo-curable resin and the mold to release them from each other. The gas-generating agent in Japanese Patent Laid-Open No. 2010-262980 generates a gas by means of light or heat and generates a gas when a polymerizable monomer in the composition is cured by light irradiation. Consequently, bubbles are generated during the curing of the composition, which leads to a transfer defect.

The method disclosed in Japanese Patent Laid-Open No. 2010-103464 uses a mechanism of generating a gas in a photo-curable resin by means of an increased pressure and a reduced pressure. Accordingly, a chamber for both pressures is necessary, and the process takes time and labor.

SUMMARY OF THE INVENTION

The present invention provides a curable composition that can be released from a mold simply within a short period of time after photo-curing by a small mold-releasing force. The present invention also provides a method of forming a pattern using such a curable composition.

The curable composition according to the present invention includes a polymerizable monomer and a polymerization initiator. The polymerization initiator initiates polymerization of the polymerizable monomer, and the curable composition cures by polymerization of the polymerizable monomer. The curable composition further includes a gas-generating agent that generates a gas by pressure application.

The method of forming a pattern according to the present invention includes a step of arranging the curable composition on a substrate to be processed, a step of bringing a mold having a contact surface provided with a depression pattern into contact with the curable composition on the substrate to be processed, a step of curing the curable composition by irradiating the curable composition being in contact with the mold with heat or light, a step of generating a gas by applying a pressure to the curable composition being in contact with the mold, and a step of releasing the mold and the curable composition from each other. Thus, the method of forming a pattern of the present invention provides a patterned cured product on the substrate. The present invention can provide a curable composition that sequentially generates a gas by application of a pressure for a short time. Consequently, the mold can be removed simply within a short period of time after photo-curing by a small mold-releasing force, and a pattern having less defects such as bubbles can be formed.

Further features of the present invention will become apparent from the following description of exemplary embodiments with reference to the attached drawings.

DESCRIPTION OF THE EMBODIMENT

Figure 1A:
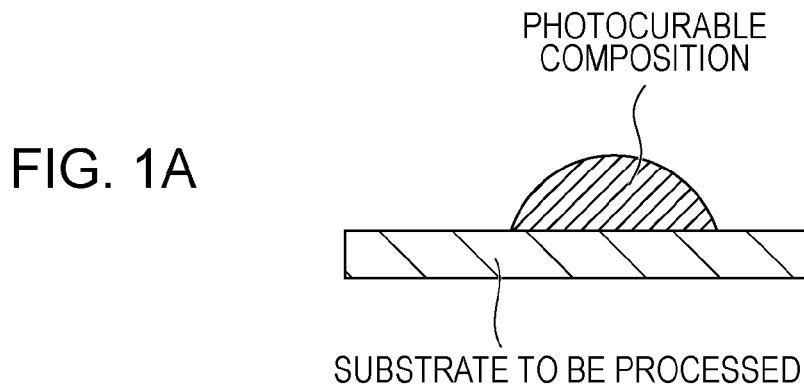
FIGS. 1A to 1G are diagrams schematically illustrating each step of a method of forming a pattern.

A curable composition according to an embodiment includes a polymerizable monomer (A), a polymerization initiator (B), and also a gas-generating agent (C).

Though a photo-curable composition that cures by light irradiation will be described in detail in the embodiment, the curable composition of the present invention may be one that polymerizes by stimulation other than light, such as a heat-curable composition that cures by heat application.

The components (A), (B), and (C) will now be described.

Polymerizable Monomer (A)

Examples of the polymerizable monomer include radical polymerizable monomers and cationic polymerizable monomers.

In the embodiment, the radical polymerizable monomer can be a compound having at least one acryloyl group or methacryloyl group.

Examples of the monofunctional (meth)acrylic compound having at least one acryloyl group or methacryloyl group include, but not limited to, phenoxyethyl (meth)acrylate, phenoxy-2-methylethyl (meth)acrylate, phenoxyethoxyethyl (meth) acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, EO-modified p-cumyl phenyl (meth)acrylate, 2-bromophenoxyethyl (meth)acrylate, 2,4-dibromophenoxyethyl (meth) acrylate, 2,4,6-tribromophenoxyethyl (meth) acrylate, EO-modified phenoxy (meth)acrylate, PO-modified phenoxy (meth)acrylate, polyoxyethylene nonylphenyl ether (meth)acrylate, isobornyl (meth) acrylate, bornyl (meth) acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloyl morpholine, 2-hydroxyethyl (meth)acrylate, 2-hydroxypropyl (meth)acrylate, 2-hydroxybutyl (meth) acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth)acrylate, benzyl (meth) acrylate, tetrahydrofurfuryl (meth) acrylate, butoxyethyl (meth) acrylate, ethoxydiethylene glycol (meth) acrylate, polyethylene glycol mono (meth)acrylate, polypropylene glycol mono(meth)acrylate, methoxyethylene glycol (meth)acrylate, ethoxyethyl (meth) acrylate, methoxypolyethylene glycol (meth) acrylate, methoxypolypropylene glycol (meth)acrylate, diacetone (meth) acrylamide, isobutoxymethyl (meth) acrylamide, N,N-dimethyl (meth) acrylamide, t-octyl (meth) acrylamide, dimethylaminoethyl (meth) acrylate, diethylaminoethyl (meth) acrylate, 7-amino-3,7-dimethyloctyl (meth)acrylate, N,N-diethyl (meth)acrylamide, and N,N-dimethylaminopropyl (meth) acrylamide.

Commercially available examples of the monofunctional (meth)acrylic compound include, but not limited to, Aronix M101, M102, M110, M111, M113, M117, M5700, TO-1317, M120, M150, and M156 (the above listed products are manufactured by Toa Gosei Co., Ltd.), LA, IBXA, 2-MTA, HPA, Viscoat #150, #155, #158, #190, #192, #193, #220, #2000, #2100, and #2150 (the above listed products are manufactured by Osaka Organic Chemical Industry Ltd.), Light Acrylate BO-A, EC-A, DMP-A, THF-A, HOP-A, HOA-MPE, HOA-MPL, PO-A, P-200A, NP-4EA, and NP-8EA, and Epoxy Ester M-600A (the above listed products are manufactured by Kyoeisha Chemical Co., Ltd.), KAYARAD TC110S, R-564, and R-128H (the above listed products are manufactured by Nippon Kayaku Co., Ltd.), NK Ester AMP-10G and AMP-20G (the above listed products are manufactured by Shin-Nakamura Chemical Co., Ltd.), FA-511A, 512A, and 513A (the above listed products are manufactured by Hitachi Chemical Co., Ltd.), PHE, CEA, PHE-2, PHE-4, BR-31, BR-31M, and BR-32 (the above listed products are manufactured by Daiich Kogyo Seiyaku Co., Ltd.), VP (manufactured by BASF), and ACMO, DMAA, and DMA-PAA (the above listed products are manufactured by Kohjin Co., Ltd.).

Examples of the multifunctional (meth)acrylic compound having two or more acryloyl or methacryloyl groups include, but not limited to, trimethylolpropane di(meth)acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, pentaerythritol tri(meth)acrylate, pentaerythritol tetra(meth)acrylate, ethylene glycol di(meth) acrylate, tetraethylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, tris(2-hydroxyethyl)isocyanurate tri(meth)acrylate, tris(acryloyloxy)isocyanurate, bis(hydroxymethyl)tricyclodecane di(meth)acrylate, dipentaerythritol penta(meth)acrylate, dipentaerythritol hexa(meth)acrylate, EO-modified 2,2-bis (4-((meth)acryloxy)phenyl)propane, PO-modified 2,2-bis(4-((meth)acryloxy)phenyl)propane, and EO,PO-modified 2,2-bis(4-((meth)acryloxy)phenyl)propane.

Commercially available examples of the multifunctional (meth)acrylic compound include, but not limited to, Yupimer UV SA1002 and SA2007 (the above listed products are manufactured by Mitsubishi Chemical Corp.), Viscoat #195, #230, #215, #260, #335HP, #295, #300, #360, and #700, GPT, and 3PA (the above listed products are manufactured by Osaka Organic Chemical Industry, Ltd.), Light Acrylate 4EG-A, 9EG-A, NP-A, DCP-A, BP-4EA, BP-4PA, TMP-A, PE-3A, PE-4A, and DPE-6A (the above listed products are manufactured by Kyoeisha Chemical Co., Ltd.), KAYARAD PET-30, TMPTA, R-604, DPHA, and DPCA-20, -30, -60, and -120, HX-620, D-310, and D-330 (the above listed products are manufactured by Nippon Kayaku Co., Ltd.), Aronix M208, M210, M215, M220, M240, M305, M309, M310, M315, M325, and M400 (the above listed products are manufactured by Toa Gosei Co., Ltd.), and Ripoxy VR-77 and VR-60 (the above listed products are manufactured by Showa Highpolymer Co., Ltd.).

These radical polymerizable monomers may be used alone or in combination of two or more thereof. In the above, the term "(meth)acrylate" means acrylate and/or methacrylate; the term "(meth)acryloyl group" means acryloyl group and/or methacryloyl group; the term "EO" refers to ethylene oxide; the term "EO-modified compound" refers to a compound having a block structure of ethylene oxide groups; the term "PO" refers to propylene oxide; and the term "PO-modified compound" refers to a compound having a block structure of propylene oxide groups.

Polymerizable Monomer (A): Cationic Polymerizable Component

The cationic polymerizable monomer as the polymerizable monomer (A) can be a compound having at least one vinyl ether, epoxy, or oxetanyl group.

Examples of the compound having one vinyl ether group include, but not limited to, methyl vinyl ether, ethyl vinyl ether, propyl vinyl ether, n-butyl vinyl ether, t-butyl vinyl ether, 2-ethylhexyl vinyl ether, n-nonyl vinyl ether, lauryl vinyl ether, cyclohexyl vinyl ether, cyclohexylmethyl vinyl ether, 4-methylcyclohexylmethyl vinyl ether, benzyl vinyl ether, dicyclopentenyl vinyl ether, 2-dicyclopentenoxyethyl vinyl ether, methoxyethyl vinyl ether, ethoxyethyl vinyl ether, butoxyethyl vinyl ether, methoxyethoxyethyl vinyl ether, ethoxyethoxyethyl vinyl ether, methoxypolyethylene glycol vinyl ether, tetrahydrofurfuryl vinyl ether, 2-hydroxyethyl vinyl ether, 2-hydroxypropyl vinyl ether, 4-hydroxybutyl vinyl ether, 4-hydroxymethylcyclohexylmethyl vinyl ether, diethylene glycol monovinyl ether, polyethylene glycol vinyl ether, chloroethyl vinyl ether, chlorobutyl vinyl ether, chloroethoxyethyl vinyl ether, phenylethyl vinyl ether, and phenoxypolyethylene glycol vinyl ether.

Examples of the compound having two or more vinyl ether groups include, but not limited to, divinyl ethers such as ethylene glycol divinyl ether, diethylene glycol divinyl ether, polyethylene glycol divinyl ether, propylene glycol divinyl ether, butylene glycol divinyl ether, hexanediol divinyl ether, bisphenol A alkylene oxide divinyl ether, and bisphenol F alkylene oxide divinyl ether; and multifunctional vinyl ethers such as trimethylolethane trivinyl ether, trimethylolpropane trivinyl ether, ditrimethylolpropane tetravinyl ether, glycerin trivinyl ether, pentaerythritol tetravinyl ether, dipentaerythritol pentavinyl ether, dipentaerythritol hexavinyl ether, an ethylene oxide adduct of trimethylolpropane trivinyl ether, a propylene oxide adduct of trimethylolpropane trivinyl ether, an ethylene oxide adduct of ditrimethylolpropane tetravinyl ether, a propylene oxide adduct of ditrimethylolpropane tetravinyl ether, an ethylene oxide adduct of pentaerythritol tetravinyl ether, a propylene oxide adduct of pentaerythritol tetravinyl ether, an ethylene oxide adduct of dipentaerythritol hexavinyl ether, and a propylene oxide adduct of dipentaerythritol hexavinyl ether.

Examples of the compound having one epoxy group include, but not limited to, phenyl glycidyl ether, p-tert-butylphenyl glycidyl ether, butyl glycidyl ether, 2-ethylhexyl glycidyl ether, allyl glycidyl ether, 1,2-butylene oxide, 1,3- butadiene monooxide, 1,2-epoxydodecane, epichlorohydrin, 1,2-epoxydecane, styrene oxide, cyclohexene oxide, 3-methacryloyloxymethylcyclohexene oxide, 3-acryloyloxymethylcyclohexene oxide, and 3-vinylcyclohexene oxide.

Examples of the compound having two or more epoxy groups include, but not limited to, bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolac resin, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxycyclohexane carboxylate, 2-(3,4-epoxycyclohexyl-5,5-spiro-3,4-epoxy)cyclohexane-meta-dioxane, bis(3,4-epoxycyclohexylmethyl) adipate, vinylcyclohexene oxide, 4-vinylepoxycyclohexane, bis(3,4-epoxy-6-methylcyclohexylmethyl) adipate, 3,4-epoxy-6-methylcyclohexyl-3',4'-epoxy-6'-methylcyclohexane carboxylate, methylene bis(3,4-epoxycyclohexane), dicyclopentadiene diepoxide, ethylene glycol di(3,4-epoxycyclohexylmethyl)ether, ethylene bis(3,4-epoxycyclohexane carboxylate), dioctyl epoxyhexahydrophthalate, di-2-ethylhexyl epoxyhexahydrophthalate, 1,4-butanediol diglycidyl ether, 1,6-hexanediol diglycidyl ether, glycerin triglycidyl ether, trimethylolpropane triglycidyl ether, polyethylene glycol diglycidyl ethers, polypropylene glycol diglycidyl ethers, 1,1,3-tetradecadiene dioxide, limonene dioxide, 1,2,7,8-diepoxyoctane, and 1,2,5,6-diepoxycyclooctane.

Examples of the compound having one oxetanyl group include, but not limited to, 3-ethyl-3-hydroxymethyl oxetane, 3-(meth)allyloxymethyl-3-ethyl oxetane, (3-ethyl-3-oxetanylmethoxy)methylbenzene, 4-fluoro-[1-(3-ethyl-3-oxetanylmethoxy)methyl]benzene, 4-methoxy[1-(3-ethyl-3-oxetanylmethoxy)methyl]benzene, [1-(3-ethyl-3-oxetanylmethoxy)ethyl]phenyl ether, isobutoxymethyl(3-ethyl-3-oxetanylmethyl) ether, isobornyloxyethyl(3-ethyl-3-oxetanylmethyl) ether, isobornyl(3-ethyl-3-oxetanylmethyl) ether, 2-ethylhexyl(3-ethyl-3-oxetanylmethyl) ether, ethyldiethylene glycol(3-ethyl-3-oxetanylmethyl) ether, dicyclopentadiene(3-ethyl-3-oxetanylmethyl) ether, dicyclopentenyloxyethyl(3-ethyl-3-oxetanylmethyl) ether, dicyclopentenyl(3-ethyl-3-oxetanylmethyl) ether, tetrahydrofurfuryl(3-ethyl-3-oxetanylmethyl) ether, tetrabromophenyl(3-ethyl-3-oxetanylmethyl) ether, 2-tetrabromophenoxyethyl(3-ethyl-3-oxetanylmethyl) ether, tribromophenyl(3-ethyl-3-oxetanylmethyl) ether, 2-tribromophenoxyethyl(3-ethyl-3-oxetanylmethyl) ether, 2-hydroxyethyl(3-ethyl-3-oxetanylmethyl) ether, 2-hydroxypropyl(3-ethyl-3-oxetanylmethyl) ether, butoxyethyl(3-ethyl-3-oxetanylmethyl) ether, pentachlorophenyl(3-ethyl-3-oxetanylmethyl) ether, pentabromophenyl(3-ethyl-3-oxetanylmethyl) ether, and bornyl(3-ethyl-3-oxetanylmethyl) ether.

Examples of the compound having two or more oxetanyl groups include, but not limited to, 3,7-bis(3-oxetanyl)-5-oxanonane, 3,3'-(1,3-(2-methylenyl)propanediylbis(oxymethylene))bis(3-ethyloxetane), 1,4-bis[(3-ethyl-3-oxetanylmethoxy)methyl]benzene, 1,2-bis[(3-ethyl-3-oxetanylmethoxy)methyl]ethane, 1,3-bis[(3-ethyl-3-oxetanylmethoxy)methyl]propane, ethylene glycol bis(3-ethyl-3-oxetanylmethyl)ether, dicyclopentenyl bis(3-ethyl-3-oxetanylmethyl)ether, triethylene glycol bis(3-ethyl-3-oxetanylmethyl)ether, tetraethylene glycol bis(3-ethyl-3-oxetanylmethyl)ether, tricyclodecane diyldimethylene (3-ethyl-3-oxetanylmethyl)ether, trimethylol propane tris(3-ethyl-3-oxetanylmethyl)ether, 1,4-bis(3-ethyl-3-oxetanylmethoxy)butane, 1,6-bis(3-ethyl-3-oxetanylmethoxy)hexane, pentaerythritol tris(3-ethyl-3-oxetanylmethyl)ether, pentaerythritol tetrakis(3-ethyl-3-oxetanylmethyl)ether, polyethylene glycol bis(3-ethyl-3-oxetanylmethyl)ether, dipentaerythritol hexakis(3-ethyl-3-oxetanylmethyl)ether, dipentaerythritol pentakis(3-ethyl-3-oxetanylmethyl)ether, dipentaerythritol tetrakis(3-ethyl-3-oxetanylmethyl)ether, caprolactone-modified dipentaerythritol hexakis(3-ethyl-3-oxetanylmethyl)ether, caprolactone-modified dipentaerythritol pentakis(3-ethyl-3-oxetanylmethyl)ether, ditrimethylolpropane tetrakis(3-ethyl-3-oxetanylmethyl)ether, EO-modified bisphenol A bis(3-ethyl-3-oxetanylmethyl)ether, PO-modified bisphenol A bis(3-ethyl-3-oxetanylmethyl)ether, EO-modified hydrogenated bisphenol A bis(3-ethyl-3-oxetanylmethyl)ether, PO-modified hydrogenated bisphenol A bis(3-ethyl-3-oxetanylmethyl)ether, and EO-modified bisphenol F (3-ethyl-3-oxetanylmethyl)ether.

These cationic polymerizable monomers may be used alone or in combination of two or more thereof. In the above, the term "EO" refers to ethylene oxide; the term "EO-modified compound" refers to a compound having a block structure of ethylene oxide groups; the term "PO" refers to propylene oxide; the term "PO-modified compound" refers to a compound having a block structure of propylene oxide groups; and the term "hydrogenated" means adding hydrogen atoms to a C=C double bond such as those in a benzene ring.

Polymerization Initiator (B)

When the polymerizable monomer (A) is a radical polymerizable monomer, the polymerization initiator (B) is one that generates a radical by irradiation with light (radiation, e.g., infrared light, visible light, ultraviolet light, far ultraviolet light, X-rays, or charged particle rays such as electron rays). When the polymerizable monomer (A) is a cationic polymerizable monomer, the polymerization initiator (B) is one that generates an acid by light irradiation.

Examples of the radical-generating agent include, but not limited to, optionally substituted 2,4,5-triarylimidazole dimers such as a 2-(o-chlorophenyl)-4,5-diphenylimidazole dimer, a 2-(o-chlorophenyl)-4,5-di(methoxyphenyl)imidazole dimer, a 2-(o-fluorophenyl)-4,5-diphenylimidazole dimer, and a 2-(o- or p-methoxyphenyl)-4, 5-diphenylimidazole dimer; benzophenone derivatives such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone; aromatic ketone derivatives such as 2-benzyl-2-dimethylamino-1-(4-morpholinophenyl)-butanone-1, 2-methyl-1-[4-(methylthio)phenyl]-2-morpholino-propanon-1-one; quinones such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether derivatives such as benzoin methyl ether, benzoin ethyl ether, and benzoin phenyl ether; benzoin derivatives such as benzoin, methyl benzoin, ethyl benzoin, and propyl benzoin; benzyl derivatives such as benzyl dimethyl ketal; acridine derivatives such as 9-phenyl acridine and 1,7-bis(9,9'-acridinyl)heptane; N-phenylglycine derivatives such as N-phenylglycine; acetophenone derivatives such as acetophenone, 3-methylacetophenone, acetophenone benzyl ketal, 1-hydroxycyclohexylphenyl ketone, and 2,2-dimethoxy-2-phenylacetophenone; thioxanthone derivatives such as thioxanthone, diethylthioxanthone, 2-isopropylthioxanthone, and 2-chlorothioxanthone; xanthones; fluorenones; benzaldehydes; fluorenes; anthraquinones; triphenylamines; carbazoles; and 1-(4-isopropylphenyl)-2-hydroxy-2-methylpropan-1-one, 2-hydroxy-2-methyl-1-phenylpropan-1-one, 2,4,6-trimethylbenzoyldiphenylphosphine oxide, and bis(2,6-dimethoxybenzoyl)-2,4,4-trimethylpentylphosphine oxide. These may be used alone or in combination of two or more thereof.

Commercially available examples of the photo-radical-generating agent include, but not limited to, Irgacure 184, 369, 651, 500, 819, 907, 784, and 2959, CGI-1700, -1750, and -1850, CG24-61, and Darocur 1116 and 1173 (the above listed products are manufactured by Chiba Japan), Lucirin TPO, LR8893, and LR8970 (the above listed products are manufactured by BASF), and Uvecryl P36 (manufactured by UCB).

Examples of the compound used as a polymerization initiator that generates an acid by light irradiation include, but not limited to, onium salt compounds, sulfone compounds, sulfonic acid ester compounds, sulfonimide compounds, and diazomethane compounds. In particular, the onium salt compounds can be used in the embodiment.

Examples of the onium salt compound include, but not limited to, iodonium salts, sulfonium salts, phosphonium salts, diazonium salts, ammonium salts, and pyridinium salts. Specific examples of the onium salt compounds include bis(4-t-butylphenyl)iodonium perfluoro-n-butanesulfonate, bis(4-t-butylphenyl)iodonium trifluoromethanesulfonate, bis(4-t-butylphenyl)iodonium 2-trifluoromethylbenzenesulfonate, bis(4-t-butylphenyl)iodonium pyrenesulfonate, bis(4-t-butylphenyl)iodonium n-dodecylbenzenesulfonate, bis(4-t-butylphenyl)iodonium p-toluenesulfonate, bis(4-t-butylphenyl)iodonium benzenesulfonate, bis(4-t-butylphenyl)iodonium 10-camphorsulfonate, bis(4-t-butylphenyl)iodonium n-octanesulfonate, diphenyliodonium perfluoro-n-butanesulfonate, diphenyliodonium trifluoromethanesulfonate, diphenyliodonium 2-trifluoromethylbenzenesulfonate, diphenyliodonium pyrenesulfonate, diphenyliodonium n-dodecylbenzenesulfonate, diphenyliodonium p-toluenesulfonate, diphenyliodonium benzenesulfonate, diphenyliodonium 10-camphorsulfonate, diphenyliodonium n-octanesulfonate, triphenylsulfonium perfluoro-n-butanesulfonate, triphenylsulfonium trifluoromethanesulfonate, triphenylsulfonium 2-trifluoromethylbenzenesulfonate, triphenylsulfonium pyrenesulfonate, triphenylsulfonium n-dodecylbenzenesulfonate, triphenylsulfonium p-toluenesulfonate, triphenylsulfonium benzenesulfonate, triphenylsulfonium 10-camphorsulfonate, triphenylsulfonium n-octanesulfonate, diphenyl(4-t-butylphenyl)sulfonium perfluoro-n-butanesulfonate, diphenyl(4-t-butylphenyl)sulfonium trifluoromethanesulfonate, diphenyl(4-t-butylphenyl)sulfonium 2-trifluoromethylbenzenesulfonate, diphenyl(4-t-butylphenyl)sulfonium pyrenesulfonate, diphenyl(4-t-butylphenyl)sulfonium n-dodecylbenzenesulfonate, diphenyl(4-t-butylphenyl)sulfonium p-toluenesulfonate, diphenyl(4-t-butylphenyl)sulfonium benzenesulfonate, diphenyl(4-t-butylphenyl)sulfonium 10-camphorsulfonate, diphenyl(4-t-butylphenyl)sulfonium n-octanesulfonate, tris(4-methoxyphenyl)sulfonium perfluoro-n-butanesulfonate, tris(4-methoxyphenyl)sulfonium trifluoromethanesulfonate, tris(4-methoxyphenyl)sulfonium 2-trifluoromethylbenzenesulfonate, tris(4-methoxyphenyl)sulfonium pyrenesulfonate, tris(4-methoxyphenyl)sulfonium n-dodecylbenzenesulfonate, tris(4-methoxyphenyl)sulfonium p-toluenesulfonate, tris(4-methoxyphenyl)sulfonium benzenesulfonate, tris(4-methoxyphenyl)sulfonium 10-camphorsulfonate, and tris(4-methoxyphenyl)sulfonium n-octanesulfonate.

Examples of the sulfone compound include, but not limited to, β-ketosulfone, β-sulfonylsulfone, and α-diazo compounds thereof. Specific examples of the sulfone compound include phenacyl phenyl sulfone, mesityl phenacyl sulfone, bis(phenylsulfonyl)methane, and 4-trisphenacyl sulfone.

Examples of the sulfonic acid ester compound include, but not limited to, alkylsulfonic acid esters, haloalkylsulfonic acid esters, arylsulfonic acid esters, and iminosulfonates. Specific examples of the sulfonic acid ester compound include, but not limited to, α-methylolbenzoin perfluoro-n-butanesulfonate, α-methylolbenzoin trifluoromethanesulfonate, and α-methylolbenzoin 2-trifluoromethylbenzenesulfonate.

Specific examples of the sulfonimide compound include, but not limited to, N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hept-5-ene-2,3-dicarboxyimide, N-(trifluoromethylsulfonyloxy)-7-oxabicyclo[2.2.1]hept-5-ene-2,3-dicarboxyimide, N-(trifluoromethylsulfonyloxy)bicyclo[2.2.1]heptane-5,6-oxy-2,3-dicarboxyimide, N-(trifluoromethylsulfonyloxy)naphthylimide, N-(10-camphorsulfonyloxy)succinimide, N-(10-camphorsulfonyloxy)phthalimide, N-(10-camphorsulfonyloxy)diphenylmaleimide, N-(10-camphorsulfonyloxy)bicyclo[2.2.1]hept-5-ene-2,3-dicarboxyimide, N-(10-camphorsulfonyloxy)-7-oxabicyclo[2.2.1]hept-5-ene-2,3-dicarboxyimide, N-(10-camphorsulfonyloxy)bicyclo[2.2.1]heptane-5,6-oxy-2,3-dicarboxyimide, N-(10-camphorsulfonyloxy)naphthylimide, N-(4-methylphenylsulfonyloxy)succinimide, N-(4-methylphenylsulfonyloxy)phthalimide, N-(4-methylphenylsulfonyloxy)diphenylmaleimide, N-(4-methylphenylsulfonyloxy)bicyclo[2.2.1]hept-5-ene-2,3-dicarboxyimide, N-(4-methylphenylsulfonyloxy)-7-oxabicyclo[2.2.1]hept-5-ene-2,3-dicarboxyimide, N-(4-methylphenylsulfonyloxy)bicyclo[2.2.1]heptane-5,6-oxy-2,3-dicarboxyimide, N-(4-methylphenylsulfonyloxy)naphthylimide, N-(2-trifluoromethylphenylsulfonyloxy)succinimide, N-(2-trifluoromethylphenylsulfonyloxy)phthalimide, N-(2-trifluoromethylphenylsulfonyloxy)diphenylmaleimide, N-(2-trifluoromethylphenylsulfonyloxy)bicyclo[2.2.1]hept-5-ene-2,3-dicarboxyimide, N-(2-trifluoromethylphenylsulfonyloxy)-7-oxabicyclo[2.2.1]hept-5-ene-2,3-dicarboxyimide, N-(2-trifluoromethylphenylsulfonyloxy)bicyclo[2.2.1]heptane-5,6-oxy-2,3-dicarboxyimide, N-(2-trifluoromethylphenylsulfonyloxy)naphthylimide, N-(4-fluorophenylsulfonyloxy)succinimide, N-(4-fluorophenyl)phthalimide, N-(4-fluorophenylsulfonyloxy)diphenylmaleimide, N-(4-fluorophenylsulfonyloxy)bicyclo[2.2.1]hept-5-ene-2,3-dicarboxyimide, N-(4-fluorophenylsulfonyloxy)-7-oxabicyclo[2.2.1]hept-5-ene-2,3-dicarboxyimide, N-(4-fluorophenylsulfonyloxy)bicyclo[2.2.1]heptane-5,6-oxy-2,3-dicarboxyimide, and N-(4-fluorophenylsulfonyloxy)naphthylimide.

Specific examples of the diazomethane compound include, but not limited to, bis(trifluoromethylsulfonyl)diazomethane, bis(cyclohexylsulfonyl)diazomethane, bis(phenylsulfonyl)diazomethane, bis(p-toluenesulfonyl)diazomethane, methylsulfonyl p-toluenesulfonyldiazomethane, (cyclohexylsulfonyl) (1,1-dimethylethylsulfonyl)diazomethane, and bis(1,1-dimethylethylsulfonyl)diazomethane.

These polymerization initiators that generate acids by light irradiation may be used alone or in combination of two or more thereof.

The amount of the polymerization initiator (B) can be 0.01% by weight or more and 10% by weight or less, in particular, 0.1% by weight or more and 7% by weight or less of the total amount of the polymerizable monomer (A) of the present invention. When the amount is less than 0.01% by weight, the curing rate is slow, which may reduce the reaction efficiency. An amount of higher than 10% by weight may cause deterioration in mechanical characteristics of the cured product of the curable composition. Gas-generating agent (C) that generates a gas through chain reaction by pressure application The gas-generating agent (C) that generates a gas through a chain reaction by pressure application is a compound that sequentially generates a gas such as carbon dioxide, nitrogen, oxygen, or hydrogen gas by being applied with a predetermined pressure.

In particular, the gas-generating agent (C) can be one that is sequentially decomposed by a pressure to cause explosive generation of a nitrogen gas.

The gas-generating agent that is decomposed by a pressure affects an adjacent unit through a change in volume by the pressure of the generated gas to cause an instant chain reaction outside the unit, resulting in generation of a large volume of the gas in a short period time.

In contrast, decomposition by light irradiation does not cause a chain reaction and needs a light hv energy for each unit, i.e., a long time is necessary to generate a large volume of the gas.

That is, an effect of reducing a mold-releasing force can be obtained more simply within a shorter period of time by using a gas-generating agent that causes sequential explosion, compared with the case of using a gas-generating agent such as a naphthoquinone azide compound that generates mainly by light irradiation shown in Japanese Patent Laid-Open No. 2010-262980.

In addition, application of a pressure to a gas-generating agent can be achieved by further pressing the mold with a pressure higher than that in the mold-attaching step, i.e., a simple process. Consequently, it is easy to distinguish the mold-releasing step from the photo-curing step. That is, the gas-generating agent can be used as a component of a photocurable composition used in the method of forming a pattern.

An example of the gas-generating agent that is decomposed by pressure application to cause sequential decomposition and thereby explosively generate a nitrogen gas is an azide compound. The azide compound is decomposed by pressure application, and once the decomposition starts, a chain reaction occurs to explosively release a nitrogen gas. Examples of such a compound include, but not limited to, 3-azidemethyl-3-methyloxetane, terephthalazide, and p-tert-butylbenzazide; and polymers having azide groups, such as glycidylazide polymers that can be prepared by ring-opening polymerization of 3-azidemethyl-3-methyloxetane. The gas generated can be a nitrogen gas for preventing deterioration of the components, such as the polymerizable monomer, in a curable composition.

The amount of the gas-generating agent is not particularly limited. For example, the mount can be 0.01% by weight or more and 30% by weight or less, in particular, 0.1% by weight or more and 15% by weight or less of the total amount of the polymerizable monomer (A) of the present invention. When the amount is higher than 30% by weight, though the amount of the gas generated increases, the mechanical characteristics of the cured product may be deteriorated. When the amount is lower than 0.01% by weight, the amount of the gas generated is too small to provide a sufficient effect of reducing the force necessary for removing a mold. Specifically, when a curable composition for photo-nanoimprint contains 5% by weight of an azide compound as the gas-generating agent, for example, a nitrogen gas having a volume of about three times that of the gas-generating agent contained in the curable composition is generated and accumulates at the interface between the curable composition and the mold to generate a pressure for releasing from each other.

Other Components

The curable composition according to the embodiment may contain other additives such as a sensitizer, an antioxidant, a solvent, and a polymer component in the ranges that do not impair a desired mold-releasing force, in addition to the polymerizable monomer (A), the polymerization initiator (B), and the gas-generating agent (C).

The sensitizer may be added to the composition in order to accelerate the polymerization or increase the reaction conversion rate. The sensitizer is, for example, a hydrogen donor or a sensitizing dye.

The hydrogen donor is a compound that reacts with an initial radical generated from the polymerization initiator (B) or a radical of the growing polymer end to generate a radical having higher reactivity. The hydrogen donor can be added to the curable composition containing a photo-radical-generating agent as the polymerization initiator (B).

Specific examples of the hydrogen donor include, but not limited to, amine compounds such as N-butylamine, di-n-butylamine, tri-n-butylphosphine, allylthiourea, s-benzyl-isothiuronium-p-toluene sulfinate, triethylamine, diethylaminoethyl methacrylate, triethylenetetramine, 4,4'-bis (dialkylamino)benzophenone, N,N-dimethylaminobenzoic acid ethyl ester, N,N-dimethylaminobenzoic acid isoamyl ester, pentyl-4-dimethylamino benzoate, triethanolamine, and N-phenylglycine; and mercapto compounds such as 2-mercapto-N-phenylbenzimidazole and mercaptopropionic acid ester.

The sensitizing dye is a compound that is excited by absorbing light of a specific wavelength to act on the polymerization initiator (B). The action herein is energy transfer or electron transfer from the sensitizing dye in the excited state to the polymerization initiator (B).

Specific examples of the sensitizing dye include, but not limited to, anthracene derivatives, anthraquinone derivatives, pyrene derivatives, perylene derivatives, carbazole derivatives, benzophenone derivatives, thioxanthone derivatives, xanthone derivatives, coumarin derivatives, phenothiazine derivatives, camphorquinone derivatives, acridine dyes, thiopyrylium salt dyes, merocyanine dyes, quinoline dyes, styrylquinoline dyes, ketocoumarin dyes, thioxanthene dyes, xanthene dyes, oxonol dyes, cyanine dyes, rhodamine dyes, and pyrylium salt dyes.

These sensitizing agents may be used alone or in combination of two or more thereof.

The amount of the sensitizing agent in the curable composition can be 0 to 20% by weight, in particular, 0.1 to 5.0% by weight, further, 0.2 to 2.0% by weight, of the total amount of the polymerizable monomer (A). In an amount of 0.1% by weight or more of the sensitizing agent, the effect of the sensitizing agent can be more effectively shown. In an amount of 5.0% by weight or less, the cured product of the polymerizable monomer by light irradiation can have a sufficiently high molecular weight and is prevented from insufficient dissolution or from deterioration in storage stability.

Temperature in Blending of Curable Composition

The curable composition may be mixed and dissolved in a temperature range of 0 to 100° C.

Viscosity of Curable Composition

The curable composition as a mixture of components excluding the solvent can have a viscosity at 23° C. of 1 to 100 cP, in particular, 5 to 50 cP, further, 6 to 20 cP. If the viscosity is higher than 100 cP, in the mold-attaching step described below, it takes a long time to fill the finely-patterned depressions on the mold with the composition, or pattern defaults due to filling failure occurs. If the viscosity is lower than 1 cP, in the application step described below, the application becomes uneven, and in the mold-attaching step described below, the composition may flow out from the mold end.

Surface Tension of Curable Composition

The curable composition as a mixture of components excluding the solvent can have a surface tension at 23° C. of 5 to 70 mN/m, in particular, 7 to 35 mN/m, further, 10 to 32 mN/m.

If the surface tension is lower than 5 mN/m, in the mold-attaching step described below, it takes a long time to fill the finely-patterned depressions on the mold surface with the composition. If the surface tension is higher than 70 mN/m, the surface has low smoothness.

Particles Mixed in Curable Composition

In order to prevent occurrence of defaults in protrusion pattern formed on a cured product of the polymerizable monomer (A), the component mixture may be filtered through, for example, a filter having a pore diameter of 0.001 to 5.0 μm to remove particles mixed into the curable composition. The filtration can be multi-stage filtration or may be repeated multiple times. The filtrate may be re-filtered. The material of the filter is not particularly limited. For example, a filter made of a polyethylene, polypropylene, fluorine, or nylon resin can be used.

Metal Impurities Mixed in Curable Composition

In the curable composition for producing a semiconductor integrated circuit, contamination of metal impurities in the curable composition should be prevented as much as possible in order to avoid obstruction in behavior of the product. Accordingly, the concentration of metal impurities in the curable composition should be 10 ppm or less, in particular, 100 ppb or less.

Photo-nanoimprint Method

The method of forming a pattern of the present invention includes a step of arranging the curable composition on a substrate to be processed, a step of bringing a mold having a contact surface provided with a depression pattern into contact with the curable composition on the substrate, a step of curing the curable composition by irradiating the curable composition being in contact with the mold with heat or light, a step of generating a gas by applying a pressure to the curable composition being in contact with the mold, and a step of releasing the mold and the curable composition from each other. Thus, the method of forming a pattern of the present invention provides a patterned cured product on the substrate.

Each step of the method of forming a pattern according to the embodiment will now be described.

Step of Arranging Curable Composition on Substrate to be Processed (FIG. 1A)

As the step of arranging the curable composition, application is employed in the embodiment. The curable composition is applied onto a substrate to be processed. As the substrate to be processed, a silicon wafer can be used. Other examples of the substrate include semiconductor device substrates made of, for example, aluminum, a titanium-tungsten alloy, an aluminum-silicon alloy, an aluminum-copper-silicon alloy, silicon oxide, or silicon nitride.

The substrate to be processed may have a treated surface. The surface treatment can enhance the adhesion with the curable composition. Examples of the method of application include ink jetting, dip coating, air knife coating, curtain coating, wire bar coating, gravure coating, extrusion coating, spin coating, and slit scanning. Though the thickness of the pattern-transferred layer varies depending on the use, it can be, for example, 0.01 to 100.0 μm.

Figure 1B:
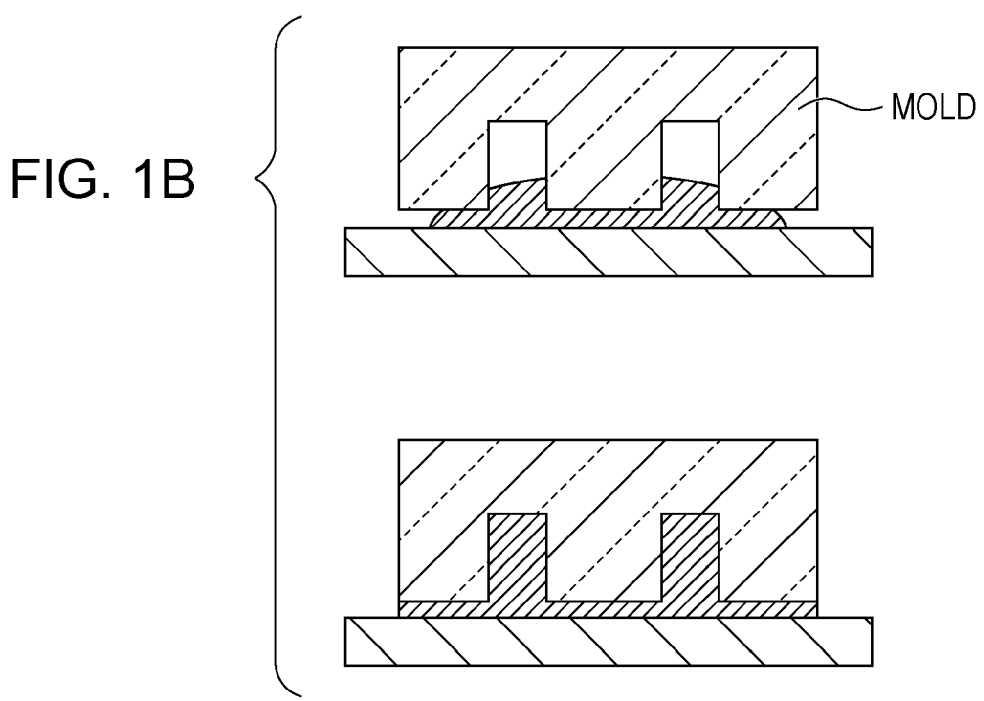

Step of Bringing a Mold Having a Contact Surface Provided with a Depression Pattern into Contact with the Curable Composition on the Substrate to be Processed (FIG. 1B)

As the step of bringing a mold having a contact surface provided with a depression pattern, a mold-attaching step is employed in the embodiment. The depressions (fine pattern) formed on the surface of the mold as a die are filled with the curable composition.

The mold is made of a light permeable material. Specific examples of the material include glass, quartz, PMMA, light permeable resins such as polycarbonate resins, transparent metal vapor-deposited films, flexible films made of, e.g., polydimethylsiloxane, photo-curable films, and metal films.

The mold used in the method of the embodiment may be subjected to surface treatment for improving the detachability between the curable composition and the mold surface. Examples of the surface treatment include treatment with a silane coupling agent such as a silicone-based or fluorine-based silane coupling agent. Commercially available application-type mold release agents such as Optool DSX manufactured by Daikin Industries, Ltd. also can be used.

The gas-generating agent can be a compound that does not generate a gas in the mold-attaching step, but generates a gas in a pressurizing step described below in which a pressure higher than that in the mold-attaching step is applied. Accordingly, the pressure in the mold-attaching step is set to be low so that the lower limit of the pressure at which the gas-generating agent does not generate a gas is high.

The time for the mold-attaching step is not particularly limited. In general, the time is 1 to 600 seconds, in particular, 1 to 300 seconds, further, 1 to 180 seconds, and further, 1 to 120 seconds. A too short time of attaching may cause insufficient filling with the curable composition, whereas a too long time of attaching makes the throughput of the method of forming a pattern low.

The method of forming a pattern of the present invention may be performed under the atmosphere, a reduced-pressure atmosphere, or an inert gas atmosphere. Specific examples of the inert gas include nitrogen, carbon dioxide, helium, argon, and various chlorofluorocarbon gases, and also gas mixtures thereof. The pressure can be 0.0001 to 10 atmospheres. In order to avoid effects of oxygen or moisture on the photo-curing reaction, the method can be performed under a reduced-pressure atmosphere or an inert gas atmosphere.

Figure 1C:
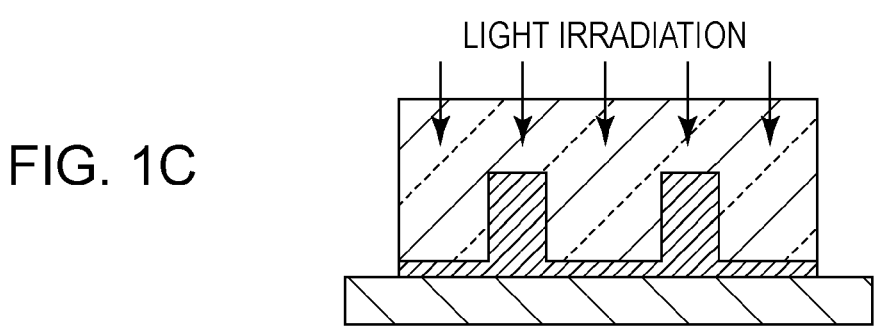

Step of Curing the Curable Composition by Irradiating the Curable Composition being in Contact with the Mold with Light (FIG. 1C)

In this step, the pattern-transferred layer is exposed to light in the state that the layer is in contact with the mold (light irradiation step). In this step, the curable composition filled in the depressions of the fine pattern on the mold cures.

The light for irradiation is not particularly limited and is appropriately selected depending on the sensitive wavelength of the curable composition, e.g., ultraviolet light having a wavelength of about 150 to 400 nm, X-rays, or electron rays. As the polymerization initiator (B), a variety of photosensitive compounds showing sensitivity to ultraviolet light are easily available, and therefore ultraviolet light can be particularly used. Examples of a light source emitting ultraviolet light include high-pressure mercury lamps, ultrahigh-pressure mercury lamps, low-pressure mercury lamps, Deep-UV lamps, carbon arc lamps, chemical lamps, metal halide lamps, xenon lamps, KrF excimer lasers, ArF excimer lasers, and F2 excimer lasers. In particular, the ultrahigh-pressure mercury lamps can be used. These radiations may be used alone or in combination. The entire pattern-transferred layer or a part of the pattern-transferred layer may be irradiated with light.

In some gas-generating agents, for example, in some azide compounds, a small volume of a gas is also generated in the light irradiation step described below depending on the wavelength of light irradiated. Accordingly, the exposure light used in curing of the curable composition is selected so as to have a wavelength at which the gas-generating agent does not generate a gas.

When the pattern-transferred layer is heat curable, thermal curing may be further performed. The thermal curing may be performed under any heating atmosphere and any heating temperature. For example, heating is performed at a temperature of 40 to 200° C. under an inert atmosphere or a reduced-pressure with a hot plate, oven, or furnace.

Figure 1D:
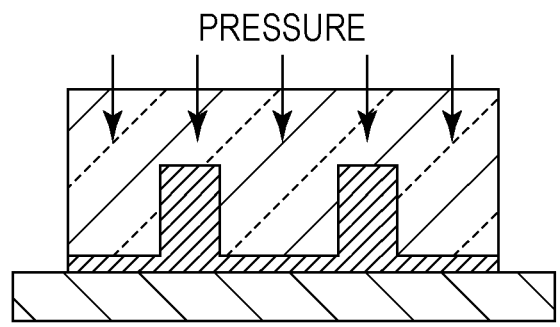

Step of Generating a Gas by Applying a Pressure to the Curable Composition being in Contact with the Mold (FIG. 1D)

In this step, a pressure higher than that in the mold-attaching step is applied to the pattern-transferred layer, i.e., to the cured product of the curable composition (pressurizing step). The application of a pressure higher than that in the mold-attaching step causes generation of a gas by the gas-generating agent. The expansion in volume of the gas weakens the adhesion between the photo-curable resin and the mold to reduce the mold-releasing force in the demolding step described below.

The pressure higher than that in mold-attaching step may be applied by any method. That is, in order to generate a pressure higher than that in the mold-attaching step between the substrate to be processed and the mold, for example, a pressure may be applied to the cured product of the curable composition for photo-nanoimprint by pressing the substrate to be processed to the mold side or by pressing the mold to the substrate side or by pressing the substrate to the mold side and simultaneously pressing the mold to substrate side.

The pressure may be generated by any means, for example, by the means used in the mold-attaching step for pressing the mold and/or the substrate. A pressure can be applied to the curable composition between the mold and the substrate by reducing the distance between the substrate and the mold so as to be shorter than the distance in the mold-attaching step.

In particular, the pressure can be applied by shifting either the mold or the substrate so as to reduce the distance therebetween, while the other being fixed.

The pressure may be applied for any period of time, but application of a pressure higher than that in the mold-attaching step for a shorter time is advantageous in light of a reduction in time of the photo-imprint process.

The upper limit of the pressure is not particularly limited as long as the shape of the pattern-transferred layer, i.e., the cured product of the curable composition for photo-nanoimprint is maintained. The frequency of application of a pressure is not particularly limited. The pressure may be applied by rotating the mold and/or the substrate to be processed multiple times.

Figure 1E:
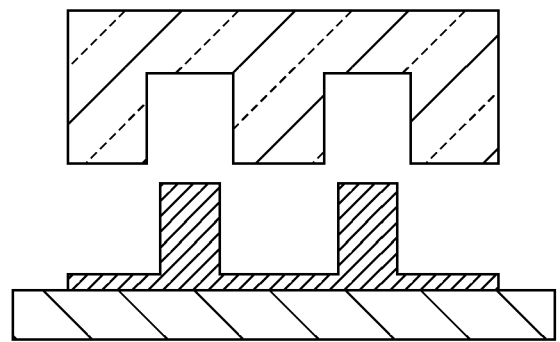

Step of Releasing the Mold and the Curable Composition from Each Other (FIG. 1E)

In this step, the mold is released from the pattern-transferred layer (demolding step). In the prior step, an inverted pattern of the fine pattern on the mold is obtained as a pattern of the cured product of the curable composition for photo-nanoimprint.

The release may be performed by any method under any conditions. That is, for example, the mold may be released from the substrate to be processed by fixing the substrate and shifting the mold so as to depart from the substrate or by fixing the mold and shifting the substrate so as to depart from the mold or by shifting both the mold and the substrate in the opposite directions from each other.

The pressure of the gas generated in the pressurizing step can be used for releasing the substrate and the mold from each other by performing the demolding step immediately after the pressurizing step, for example, within 10 seconds, in particular, 5 seconds after the pressurizing step. Accordingly, a production apparatus having a shifting unit and a controlling unit that can control the positional relationship between the substrate and the mold in the above-mentioned series of processes (mold-attaching step, light irradiation step, pressurizing step, and demolding step) can be used.

In addition, in the photo-nanoimprint method of the present invention, an application-type mold release agent can be used. That is, a step of forming an application-type mold release agent layer on the patterned surface of a mold may be performed before the mold-attaching step.

The application-type mold release agent may be any type, and examples thereof include silicon-based mold release agents, fluorine-based mold release agents, polyethylene-based mold release agents, polypropylene-based mold release agents, paraffin-based mold release agents, montan-based mold release agents, and carnauba-based mold release agents. These mold release agents may be used alone or in combination of two or more thereof. In particular, the fluorine-based mold release agents can be used in the embodiment.

Figure 1F:
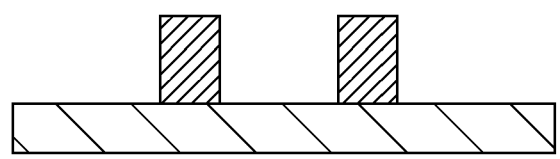

Step of Exposing the Surface of the Substrate to be Processed (FIG. 1F)

In this step, the film remaining in the depressions of the pattern-transferred layer is removed by etching to expose the surface of the substrate to be processed in the depressions of the pattern (remaining film-removing step).

The film can be removed by any known etching process, for example, by dry etching with a known dry etching apparatus. The source gas in dry etching is appropriately selected depending on the element composition of the film to be etched. Examples of the source gas include oxygen-containing gases such as $O_2$, CO, and $CO_2$; inert gases such as He, $N_2$, and Ar; chlorine-based gases such as $Cl_2$ and $BCl_3$; and gases such as $H_2$ and $NH_3$. These gases may be used as a mixture thereof.

Figure 1G:
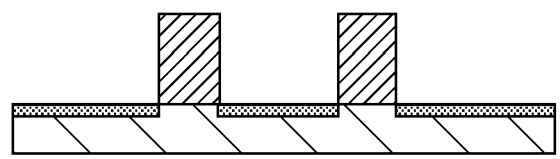

Substrate-processing Step (FIG. 1G)

The exposure of the surface of the substrate to be processed includes not only exposure of the surface before processing but also formation of depressions by etching, for example.

The pattern formed in the exposure step can be used in a semiconductor integrated circuit, for example, as an interlayer insulating film of a semiconductor device such as an LSI, a system LSI, a DRAM, an SDRAM, an RDRAM, or a D-RDRAM or as a resist film in production a semiconductor device.

Specifically, as shown in FIG. 1F, a circuit structure based on the pattern of the curable composition is formed on the substrate to be processed by, for example, etching or ion implantation of the exposed portion in the exposure step. Thus, a circuit substrate of a semiconductor device or the like can be produced. The pattern of the curable composition may be ultimately removed from the processed substrate or may be maintained as a member constituting a device.

In the embodiment, since the patterned depression of the mold has a rectangular cross section, a patterned protrusion having a rectangular cross section can be provided. This allows formation of a pattern having a rectangular cross section by etching and thereby allows formation of, for example, a wiring pattern with high accuracy.

Furthermore, the cured product formed on a substrate can be used as an optical device having a surface provided with an uneven pattern. That is, it is possible to provide an article including a base material and a cured product of a curable composition disposed on the base material.

The present invention, thus, provides a curable composition for photo-nanoimprint that can be released from a mold with a small mold-releasing force and also provides a photo-nanoimprint method that requires a small mold-releasing force.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-259271 filed Nov. 28, 2011, which is hereby incorporated by reference herein in its entirety.

What is claimed is:

1. A method of forming a pattern to provide a cured product provided with the pattern on a substrate to be processed, the method comprising:

arranging a curable composition on a substrate to be processed;

bringing a mold having a contact surface provided with a depression pattern into contact with the curable composition on the substrate to be processed;

curing the curable composition by irradiating the curable composition being in contact with the mold with heat or light;

generating a gas by applying a pressure to the curable composition being in contact with the mold; and releasing the mold and the curable composition from each other, wherein the curable composition comprises a polymerizable monomer, a polymerization initiator, and a gas-generating agent that generates a gas by pressure application, wherein the polymerization initiator initiates polymerization of the polymerizable monomer; and the curable composition cures by polymerization of the polymerizable monomer.

2. The method of forming a pattern according to claim 1, wherein the pattern has a rectangular cross section.

3. A method of producing a circuit substrate, the method comprising:

performing etching or ion implantation based on a pattern formed by a method of forming a pattern according to claim 1; and forming a circuit structure on a substrate to be processed based on the pattern.

* * * * *